United States Patent [19]

Ichinose et al.

[11] Patent Number: 5,020,029
[45] Date of Patent: May 28, 1991

[54] STATIC SEMICONDUCTOR MEMORY DEVICE WITH PREDETERMINED THRESHOLD VOLTAGES

[75] Inventors: Katsuki Ichinose; Tomohisa Wada, both of Hyogo, Japan

[73] Assignee: Mitsubishi Denki Kabushiki Kaisha, Tokyo, Japan

[21] Appl. No.: 547,263

[22] Filed: Jul. 3, 1990

[30] Foreign Application Priority Data

Jul. 5, 1989 [JP] Japan ................................. 1-174876

[51] Int. Cl.$^5$ ...................... G11C 7/00; G11C 11/40; G11C 11/00
[52] U.S. Cl. ................................... 365/154; 365/148; 365/189.01; 357/23.5
[58] Field of Search .................. 365/154, 148, 189.01; 357/23.5

[56] References Cited

U.S. PATENT DOCUMENTS 4,797,804 1/1989 Rockett, Jr. ...................... 365/154
4,805,148 2/1989 Diehl-Nagle et al. .............. 365/154
4,852,060 7/1989 Rockett, Jr. ....................... 365/154

Primary Examiner—Alyssa H. Bowler
Attorney, Agent, or Firm—Lowe, Price, LeBlanc and Becker

[57] ABSTRACT

A high resistance/load type memory cell of a static semiconductor memory device includes two load elements, two driver transistors, and two access transistors. The threshold voltage of each driver transistor is set at a high value so that the OFF resistance value of the driver transistor is 10 to 100 times the resistance value of each load resistance. The threshold voltage of each access transistor is set to be lower than the threshold voltage of each driver transistor so that the OFF resistance value of the access transistor is twice to 10 times the resistance value of each load resistance. Thus, power consumption in a standby state is reduced, while data holding characteristics of the memory cell are stabilized in selected and non-selected states.

11 Claims, 9 Drawing Sheets

(READ)

(WRITE)

STATIC SEMICONDUCTOR MEMORY DEVICE WITH PREDETERMINED THRESHOLD VOLTAGES

BACKGROUND OF THE INVENTION

1. Field of the Invention

The present invention relates to a semiconductor memory device, and more particularly, it relates to a static semiconductor memory device having high resistance load type memory cells.

2. Description of the Background Art

FIG. 8 is a block diagram showing exemplary structure of a general static random access memory (hereinafter referred to as "static RAM").

Referring to FIG. 8, a memory cell array 100 is formed by a plurality of word lines and a plurality of bit line pairs, which are arranged to intersect with each other, and memory cells provided on the intersections thereof. A row address buffer 101 amplifies or inverts an externally applied row address signal RA, to supply the same to a row decoder 102. The row decoder 102 decodes the row address signal RA, to select one of the plurality of word lines provided in the memory cell array 100. A column address buffer 103 amplifies or inverts an externally applied column address signal CA, to supply the same to a column decoder 104. The column decoder 104 decodes the column address signal CA, to select one of the plurality of bit line pairs provided in the memory cell array 100. A multiplexer 105 connects the selected bit line pair to a sense amplifier 108 through an input/output line pair.

A read/write control circuit 106 controls a data input buffer 107, the sense amplifier 108 and a data output buffer 109 in response to a chip selection signal $\overline{CS}$ and a write signal $\overline{WE}$, which are supplied from the exterior. In data writing, the data input buffer 107 amplifies externally supplied input data $D_{in}$, to supply the same to the multiplexer 105. In data reading, the sense amplifier 108 senses and amplifies a read voltage of a small amplitude which is read from the memory cell array 100. The data output buffer 109 further amplifies the level of the output from the sense amplifier 108, to output the same to the exterior as output data $D_{out}$.

FIG. 9 illustrates the structure of the memory cell array 100 in detail. In order to simplify the illustration, FIG. 9 shows only a two-by-two array of memory cells.

As shown in FIG. 9, a plurality of bit line pairs BL and $\overline{BL}$ and a plurality of word lines WL are arranged to intersect with each other, while memory cells MC1 to MC4 are provided on the intersections. The bit line pairs BL and $\overline{BL}$ are connected to an input/output line pair I/O and $\overline{I/O}$ through a plurality of transfer gates 23 and 24, which form the multiplexer 105 shown in FIG. 8. Further, the bit line pairs BL and $\overline{BL}$ are coupled to a source potential $V_{CC}$ through bit line loading transistors 21 and 22. Outputs from the row decoder 102 are supplied to the word lines WL, while outputs $Y_1$ and $Y_2$ of the column decoder 104 are supplied to the transfer gates 23 and 24.

Each of the memory cells MC1 to MC4 is formed of a high resistance/load type NMOS memory cell shown in FIG. 11, or a CMOS memory cell shown in FIG. 11, for example.

Referring to FIG. 10, a driver transistor 11 is coupled between a storage node N1 and the ground potential, while another driver transistor 12 is coupled between another storage node N2 and the ground potential. The gate of the driver transistor 11 is connected to the storage node N2, while the gate of the driver transistor 12 is connected to the storage node N1. An access transistor 13 is connected between a bit line BL and the storage node N1, while another transistor 14 is connected between another bit line $\overline{BL}$ and the storage node N2. The gates of the access transistors 13 and 14 are connected to a word line WL. Further, a load resistance 15 is coupled between a source potential $V_{CC}$ and the storage node N1, while another load resistance 16 is coupled between the source potential $V_{CC}$ and the storage node N2.

The transistors 11 to 14 are formed of N-channel MOSFETs, and the load resistances 15 and 16 have high resistance values. The driver transistors 11 and 12 and the load resistances 15 and 16 form a flip-flop. The storage nodes N1 and N2 store data which are complementary to each other. The access transistors 13 and 14 serve as transfer gates between the memory cell and the bit lines BL and $\overline{BL}$.

The memory cell shown in FIG. 11 is provided with P-channel MOSFETs 17 and 18, in place of the load resistances 15 and 16 shown in FIG. 10.

The operation of the static RAM shown in FIGS. 8 to 10 will now be described.

In response to the row address signal RA, the row decoder 102 selects one of the plurality of word lines WL to raise up its potential to a high level, while bringing potentials of the remaining word lines WL into low levels. In response to the column address signal CA, the column decoder 104 selects one of the plurality of bit line pairs BL and $\overline{BL}$ to allow conduction of the transfer gates 23 and 24 corresponding to the selected bit line pair BL and $\overline{BL}$. Thus, only the selected pair of bit lines BL and $\overline{BL}$ are connected to the input/output line pair I/O and $\overline{I/O}$, while the remaining non-selected bit line pairs BL and $\overline{BL}$ are cut off from the input/output line pair I/O and $\overline{I/O}$. Thus, selected is the memory cell, which is located on the intersection between the selected word line and the selected bit line pair BL and $\overline{BL}$. When the memory cell MC1 is selected, for example, the remaining memory cells MC2 to MC4 are in non-selected states.

The operation of the selected memory cell will now be described with reference to FIGS. 10, 12 and 13.

Referring to FIGS. 10 and 12, read operation of the selected memory cell is first described. It is assumed here that the storage node N1 stores data of "H" and the storage node N2 stores data of "L". At this time, the driver transistor 11 is in a nonconducting state, and the driver transistor 12 is in a conducting state.

When a word line WL corresponding to an address An + 1 is selected and its potential goes high, both of the access transistors 13 and 14 enter conducting states. Thus, a direct current flows through a path of a power terminal, the bit line loading transistor 22 (FIG. 9), the bit line $\overline{BL}$, the access transistor 14, the driver transistor 12 and an earth terminal. On the other hand, no direct current flows through a path of a power terminal, the bit line loading transistor 21 (FIG. 9), the bit line BL, the access transistor 13, the driver transistor 11 and an earth terminal since the driver transistor 11 is in the nonconducting state.

In this case, the bit line BL carrying no direct current has a potential which is lower than the source potential $V_{CC}$ by a threshold voltage $V_{th}$ of the bit line loading transistor 21 (FIG. 9). The bit line $\overline{BL}$ carrying the direct current has a potential which is determined by resistance partial pressure caused by ON resistances of the bit line loading transistor 22 (FIG. 9), the access transistor 14 and the driver transistor 12. This potential is lower than the source potential $V_{CC}$ by the threshold voltage $V_{th}$ and a prescribed voltage $\Delta V$ of about 50 to 500 mV in general. This voltage $\Delta V$, which is called a bit line amplitude, is adjusted by the bit line loading transistor 22.

This bit line amplitude appears on the input/output line pair I/O and $\overline{I/O}$ through the transfer gates 23 and 24. The bit line amplitude is amplified by the sense amplifier 108, further amplified by the output buffer 109, and read out to the exterior as the output data $D_{out}$ (see FIG. 9). In the data read operation, the read/write control circuit 106 (FIG. 8) controls the data input buffer 107, not to drive the input/output line pair I/O and $\overline{I/O}$.

With reference to FIGS. 10 and 13, write operation of the selected memory cell will now be described. It is assumed here that data of "L" is written in the storage node N1 and data of "H" is written in the storage node N2.

In this case, the data input buffer 107 brings the potentials of the input/output lines I/O and $\overline{I/O}$ into low and high levels respectively (see FIG. 9). Thus, the potential of the bit line BL goes low and that of the bit line $\overline{BL}$ goes high. Consequently, the potentials of the storage nodes N1 and N2 go low and high respectively within the memory cell corresponding to the address An + 1. As shown in FIG. 13, this write operation is performed when the write signal $\overline{WE}$ goes low.

With reference to the aforementioned static RAM, the characteristics of a non-selected memory cell will now be described.

When the potential of the storage node N1 is at a high level (source potential $V_{CC}$) in FIG. 10, the driver transistor 12 is in an ON state. Thus, the storage node N2 is connected to the ground potential through the ON resistance of the driver transistor 12. Since the load resistance 16 has an extremely high resistance value, the potential of the storage node N2 is equal to the ground potential. Since the potential of the storage node N2 is thus equal to the ground potential, the driver transistor 11 is in an OFF state. Therefore, the storage node N1 is charged substantially at the level of the source potential $V_{CC}$ through the load resistance 15. However, even if a gate voltage is 0 V, a fine leakage current, i.e., a subthreshold current flows in the MOSFET. Therefore, the driver transistor 11 has a finite OFF resistance even if the same is in an OFF state.

In such a static RAM, the current in its standby state is limited along standards. Therefore, it is necessary to increase the resistance values of the load resistances 15 and 16 as the storage capacity is increased. In the case of a 4-MB static RAM, it is necessary to use load resistances having extremely high resistance values of about 10 TΩ (teraohm).

An OFF resistance value of a transistor is defined here by a source-to-drain resistance value which is obtained when the transistor has a gate-to-source voltage of 0 V. The potential of the storage node N1 is determined by the resistive divisional ratio of the resistance value of the load resistance 15 to the OFF resistance value of the driver transistor 11. Thus, the storage node N1 cannot be maintained at a high potential when the resistance value of the load resistance 15 is increased. Therefore, it is necessary to set the OFF resistance values of the driver transistors 11 and 12 to be larger than the resistance values of the load resistances 15 and 16.

FIG. 14 shows the relation between a gate voltage $V_G$ of a MOSFET and a subthreshold current $I_d$. As shown in FIG. 14, the subthreshold current $I_d$ is reduced by about one place as the gate voltage $V_G$ is reduced by 0.1 V. For example, a threshold voltage $V_{th}$ is defined by the gate voltage $V_G$ obtained when the subthreshold current $I_d$ is $1 \times 10^{-6}$ A. If the threshold voltage $V_{th}$ is increased, the curve shown in FIG. 14 is rightwardly shifted to reduce the current (OFF current) which is obtained when the gate voltage $V_G$ is 0 V. The OFF resistance value is evaluated by dividing a drain voltage by an OFF current, and hence the OFF resistance value is increased by about one place when the threshold voltage $V_{th}$ is increased by 0.1 V.

Thus, when the resistance values of the load resistances 15 and 16 are increased, the resistance values of the driver transistors 11 and 12 may unavoidably become smaller than those of the load resistances 15 and 16, if the transistors of the memory cell have low threshold voltages $V_{th}$. In this case, there is such possibility that the storage node N1 cannot hold a potential close to the source potential $V_{CC}$, and the data stored in the storage nodes N1 and N2 may be inverted.

The characteristics of a selected memory cell will now be described. FIG. 15 shows the relation (transfer characteristics) between the potentials of the storage nodes N1 and N2 of the selected memory cell.

The potentials of the storage nodes N1 and N2 are stabilized at two points A and B. When the potential of the word line WL goes high in FIG. 10, the potential of the storage node N2 is weakly pulled up by the bit line loading transistor 22 (FIG. 9) through the access transistor 14. Therefore, the potential of the storage node N2 is slightly higher than the ground potential. Thus, the OFF resistance value of the driver transistor 11 is smaller than the resistance value of the load resistance 15, whereby the leakage current flowing in the driver transistor 11 is increased. Consequently, the potential of the storage node N1 is reduced. However, when the potential of the storage node N1 is reduced to a level lower than the source potential $V_{CC}$ by the threshold voltage $V_{th}$, the access transistor 13 is turned on. Thus, the storage node N1 is charged by the bit line loading transistor 21 (FIG. 9) through the access transistor 13, and hence the potential of the storage node N1 will not be reduced beyond $V_H$.

Referring to FIG. 15, the size of a circle a enclosed by two curves expressing the potentials of the storage nodes N1 and N2 serves as an index showing stability of the selected memory cell. When the circle a is large the memory cell can stably hold the data. When the threshold voltages of the transistors forming the memory cell are increased, the circle a is reduced in size and stability of the memory cell is deteriorated.

Thus, the transistors forming the memory cell preferably have high threshold voltages $V_{th}$ for holding the data in a non-selected state. However, the transistors preferably have low threshold voltages $V_{th}$ in order to ensure stability of the memory cell in a selected state. It is difficult to satisfy such inconsistent requirements as the resistance values of the load resistances are increased.

SUMMARY OF THE INVENTION

An object of the present invention is to reduce power consumption in a standby state and enable stable data holding in a selected state while ensuring stability of a selected memory cell even if load resistances forming the memory cell are set at high resistance values in a static semiconductor memory device.

Another object of the present invention is to reduce power consumption and stabilize data holding characteristics of a mass storage static semiconductor memory device.

Still another object of the present invention is to improve data holding characteristics of memory cells in selected and non-selected states in a static semiconductor memory device having high resistance/load type memory cells.

A static semiconductor memory device according to the present invention comprises at least one memory cell, a word line provided for selecting the memory cell, and a bit line pair for writing or reading information in or from the selected memory cell.

The bit line pair is formed by first and second bit lines. Each memory cell includes first and second storage nodes for storing complementary data, first and second load elements, first and second semiconductor elements for storing data, and third and fourth semiconductor elements for access operation.

The first load element is coupled between a prescribed source potential and the first storage node. The second load element is coupled between the prescribed source potential and the second storage node. The first semiconductor element is coupled between the first storage node and the ground potential, and has a control terminal which is connected to the second storage node. The second semiconductor element is coupled between the second storage node and the ground potential, and has a control terminal which is connected to the first storage node. The third semiconductor element is coupled between the first bit line and the first storage node, and has a control terminal which is connected to the word line. The fourth semiconductor element is coupled between the second bit line and the second storage node, and has a control terminal which is connected to the word line.

The threshold voltages of the first and second semiconductor elements are so set that the OFF resistance values of the first and second semiconductor elements are larger than the resistance values of the first and second load elements. The threshold voltages of the third and fourth semiconductor elements are so set that the OFF resistance values of the third and fourth semiconductor elements are larger than the resistance values of the first and second load elements and smaller than the OFF resistance values of the first and second semiconductor elements.

In the static semiconductor memory device according to the present invention, the threshold voltages of the first and second semiconductor elements for storing data are set at high values so that the OFF resistance values of the first and second semiconductor elements are larger than the resistance values of the first and second load means, whereby the data can be stably held in a non-selected state.

Further, the threshold voltages of the third and fourth semiconductor elements for access operation are set at values lower than the threshold voltages of the first and second semiconductor elements so that the OFF resistance values of the third and fourth semiconductor elements are larger than the resistance values of the first and second load means and smaller than the OFF resistance values of the first and second semiconductor elements, whereby stability in a non-selected state is improved.

According to the present invention, the threshold voltages of the first and second semiconductor elements for storing data are set at high values so that the OFF resistance values of the first and second semiconductor elements are larger than the resistance values of the first and second load elements while the threshold voltages of the third and fourth semiconductor elements for access operation are set at values lower than the threshold voltages of the first and second semiconductor elements so that the OFF resistance values of the third and fourth semiconductor elements are larger than the resistance values of the first and second load elements and smaller than the OFF resistance values of the first and second semiconductor elements. Thus, it is possible to obtain a static semiconductor memory device having excellent data holding characteristics of non-selected memory cells with no increase of a standby-state current, excellent stability of selected memory cells and a large operation margin.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates transfer characteristics of the memory cell shown in FIG. 1;

DESCRIPTION OF THE PREFERRED EMBODIMENTS

An embodiment of the present invention is now described with reference to the drawings.

Figure 1:
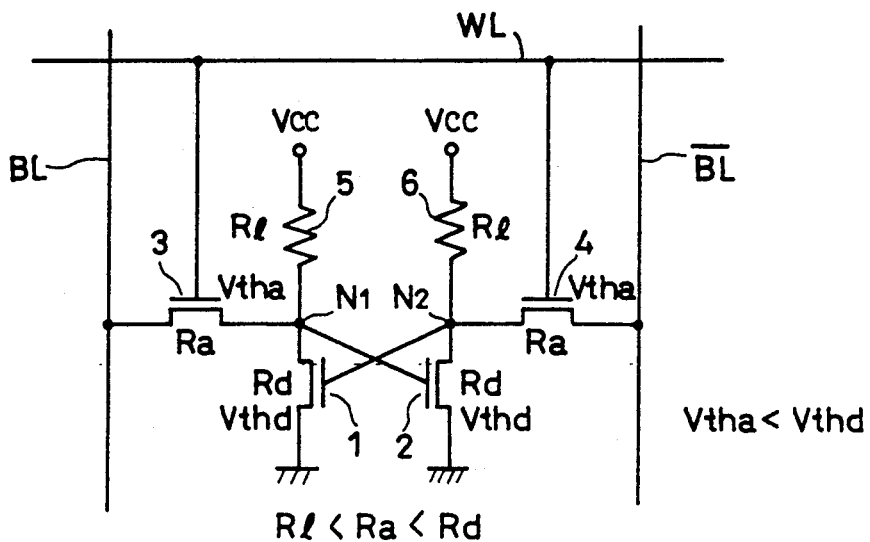
FIG. 1 is a circuit diagram showing the structure of a memory cell which is included in a static RAM according to an embodiment of the present invention.
Figure 12:
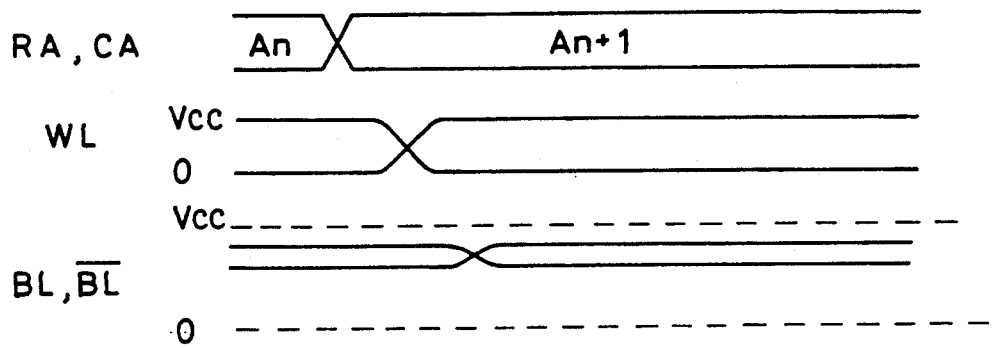
FIG. 12 is a waveform diagram for illustrating read operation in the static RAM.
Figure 13:
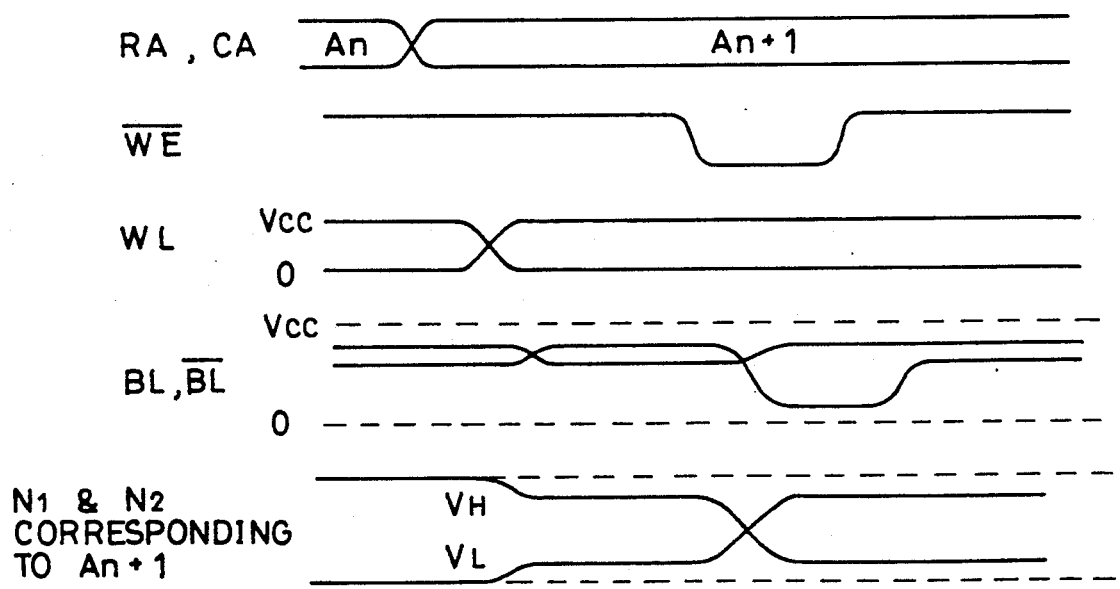
FIG. 13 is a waveform diagram for illustrating write operation in the static RAM.
Figure 14:
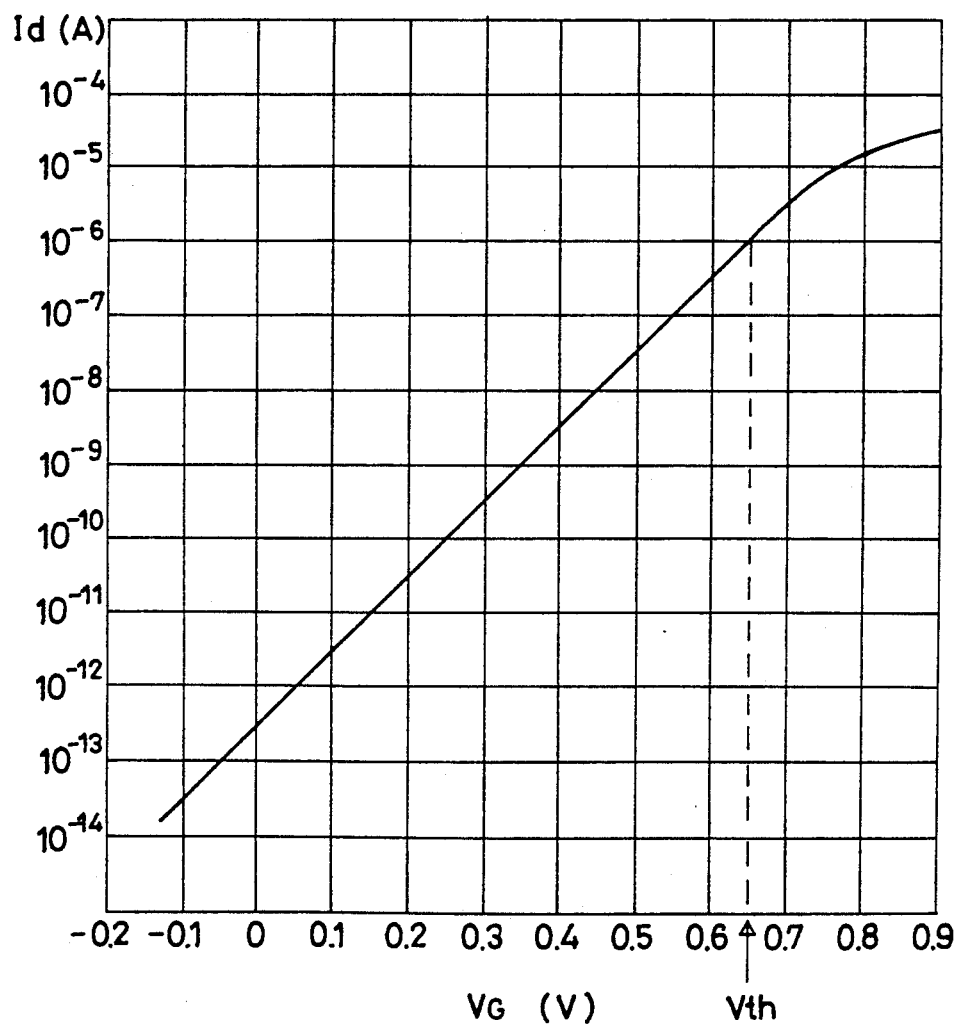
FIG. 14 illustrates the relation between a subthreshold current and a gate voltage of a transistor.
Figure 15:
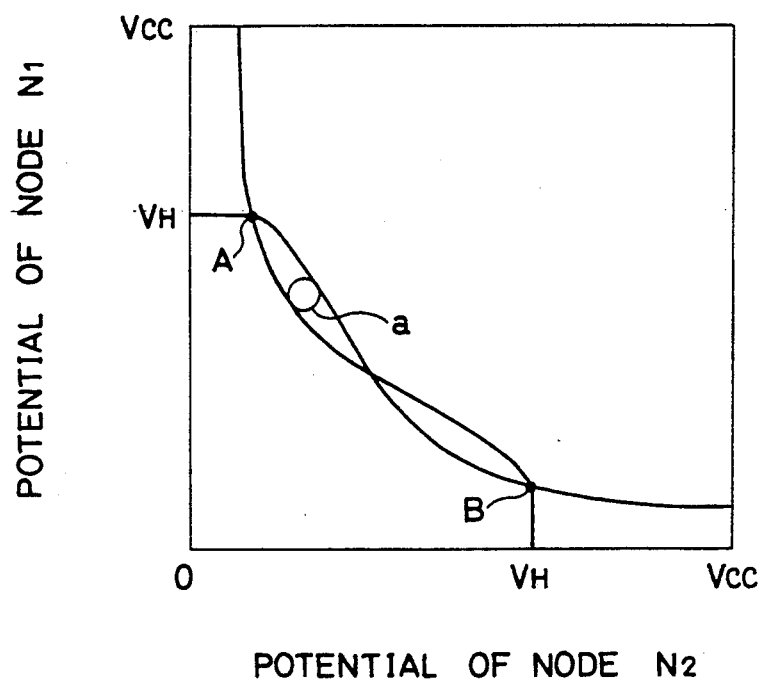
FIG. 15 illustrates transfer characteristics of a memory cell in the conventional static RAM.

FIG. 1 is a circuit diagram showing the structure of a memory cell which is included in a static RAM according to an embodiment of the present invention. The overall structure of the static RAM according to this embodiment and the structure of its memory cell array are similar to those shown in FIGS. 8 and 9 respectively. Further, read operation and write operation in the static RAM according to this embodiment are similar to those described above with reference to FIGS. 12 and 13.

Referring to FIG. 1, a driver transistor 1 is coupled between a storage node N1 and the ground potential, while another driver transistor 2 is coupled between another storage node N2 and the ground potential. The gate of the driver transistor 1 is connected to the storage node N2, and the gate of the driver transistor 2 is connected to the storage node N1. An access transistor 3 is connected between a bit line BL and the storage node N1, while another access transistor 4 is connected between another bit line $\overline{BL}$ and the storage node N2. The gates of the access transistors 3 and 4 are connected to a word line WL. A load resistance 5 is coupled between a source potential $V_{CC}$ and the storage node N1, and another load resistance 6 is coupled between the source potential $V_{CC}$ and the storage node N2.

The driver transistors 1 and 2 and the access transistors 3 and 4 have resistance values Rl respectively. Threshold voltages $V_{thd}$ of the driver transistors 1 and 2 are set at high values so that OFF resistance values $R_d$ of the driver transistors 1 and 2 are 10 to 100 times the resistance values Rl of the load resistances 5 and 6. Threshold voltages $V_{tha}$ of the access transistors 3 and 4 are set at values which are lower than the threshold voltages $V_{thd}$ of the driver transistors 1 and 2, so that OFF resistance values $R_a$ of the access transistors 3 and 4 are twice to 10 times the resistance values Rl of the load resistances 5 and 6. As hereinabove described, the OFF resistance values of each transistor is changed by about one place when its threshold voltage is changed by 0.1 V.

The driver transistors 1 and 2 and the load resistances 5 and 6 form a flip-flop, so that the storage nodes N1 and N2 store data which are complementary to each other. The access transistors 3 and 4 serve as transfer gates between the memory cell and the bit lines BL and $\overline{BL}$.

The characteristics of the memory cell shown in FIG. 1 will now be described. In the following description, it is assumed that the storage node N1 stores data of "H", and the storage node N2 stores data of "L".

First, the characteristics in a non-selected state are described.

The word line WL is maintained at the ground potential, and the storage node N1 is charged at the source potential $V_{CC}$ through the load resistance 5. Although the driver transistor 1 is in an OFF state, a leakage current flows to a grounding line from the storage node N1 since the OFF resistance value $R_d$ of the driver transistor 1 is finite. However, no data will be lost by potential reduction in the storage node N1 since the OFF resistance value $R_d$ of the driver transistor 1 is set at about 10 to 100 times the resistance value Rl of the load resistance 5.

At this time, the bit line BL is generally precharged at the source potential $V_{CC}$ or a potential which is lower than the source potential $V_{CC}$ by the threshold voltage $V_{th}$ of the bit line loading transistor, and the potential of the word line WL is 0 V (ground potential). Thus, the gate-to-source voltage of the access transistor 3 is $-V_{CC}$ or $-(V_{CC}-V_{th})$, whereby the access transistor 3 is sufficiently in an OFF state. Therefore, a leakage current flowing between the storage node N1 and the bit line BL is negligibly small.

On the other hand, the bit line $\overline{BL}$ is precharged at the source potential $V_{CC}$ or a potential which is lower than the source potential $V_{CC}$ by the threshold voltage $V_{th}$ of the bit line loading transistor. In this case, the potential of the storage node N2 is 0 V (ground potential) since the driver transistor 2 is in an ON state. Further, the access transistor 4 is in an OFF state since the potential of the word line WL is 0 V. The gate-to-source voltage of the access transistor 4 is 0 V, and hence a leakage current flows from the bit line $\overline{BL}$ to the storage node N2. However, no data will be lost by potential increase of the storage node N2 since the driver transistor 2 is in an ON state.

Thus, the threshold voltages $V_{tha}$ of the access transistors 3 and 4 are irrelevant to data holding characteristics of the memory cell which is in a non-selected state.

As hereinabove described, no data will be lost by a leakage current flowing in the access transistor 4, while this leakage current may increase power consumption in a standby state. The standby-state current mainly consists of a current flowing in the load resistance 6. This current is determined by the resistance value Rl of the load resistance 6. The remaining part of the standby-state current consists of leakage currents flowing in the driver transistor 1 and the access transistor 4. The OFF resistance value $R_d$ of the driver transistor 1 is sufficiently larger than the resistance value Rl of the load resistance 6, and hence the leakage current flowing in the driver transistor 1 is negligibly smaller than the current flowing in the load resistance 6.

On the other hand, the leakage current flowing in the access transistor 4 is determined by the threshold voltage $V_{tha}$ of the access transistor 4. When this leakage current is substantially equal to or in excess of the current flowing in the load resistance 6, the standby-state current may be increased beyond a standard value. Therefore, it is necessary to set the threshold voltage $V_{tha}$ of the access transistor 4 at such a value that the standby-state current is not increased by the leakage current. The standby-state current will not be increased if the OFF resistance value $R_a$ of the access transistor 4 is set at twice to 10 times the resistance value Rl of the load resistance 6 in consideration of a margin.

Figure 2:
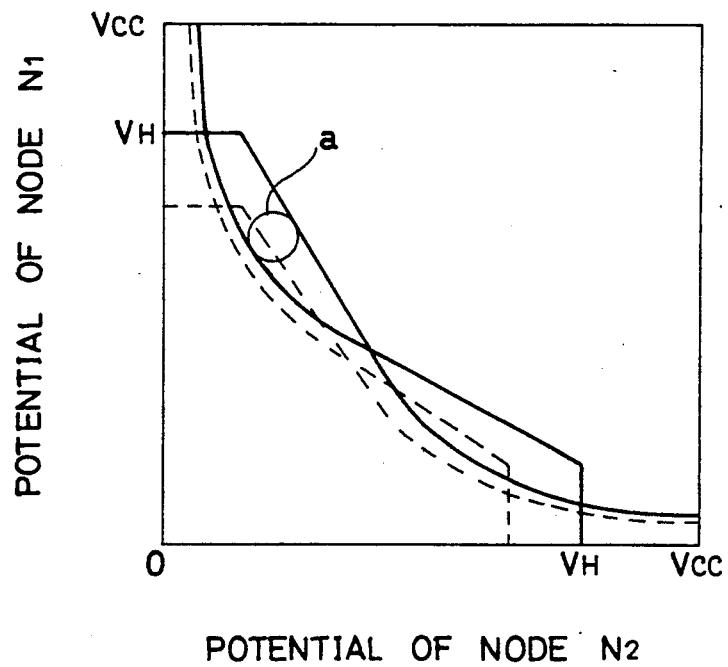

With reference to FIG. 2, the characteristics of the memory cell in a selected state will now be described.

The size of a circle a, which is defined between two curves expressing transfer characteristics of the storage nodes N1 and N2, is increased when the driver transistors 1 and 2 have high threshold voltages, while the same is reduced when the access transistors 3 and 4 have high threshold voltages. This is because a high-level potential $V_H$ of the storage node N1 or N2 depends on the threshold voltages of the access transistors 3 and 4, such that the high-level potential $V_H$ is reduced as the threshold voltages are increased. Therefore, if the threshold voltages of the access transistors 3 and 4 are set at high values similarly to the threshold voltages of the driver transistors 1 and 2, the size of the circle a is reduced to deteriorate stability of the memory cell.

According to this embodiment, however, the threshold voltages $V_{tha}$ of the access transistors 3 and 4 are set at values which are lower than the threshold voltages $V_{thd}$ of the driver transistors 1 and 2, whereby the high-level potential $V_H$ of the storage node N1 or N2 is increased. Thus, the circle a is increased in size to improve stability of the memory cell. For the purpose of comparison, FIG. 2 also shows transfer characteristics of a conventional memory cell in broken lines.

In this case, the threshold voltages $V_{tha}$ of the access transistors 3 and 4 are so set that the OFF values $R_a$ of the access transistors 3 and 4 are twice to 10 times the resistance values Rl of the load resistances 5 and 6, whereby no power consumption is increased in a standby state.

The characteristics of the memory cell in data writing are now described.

Figure 9:
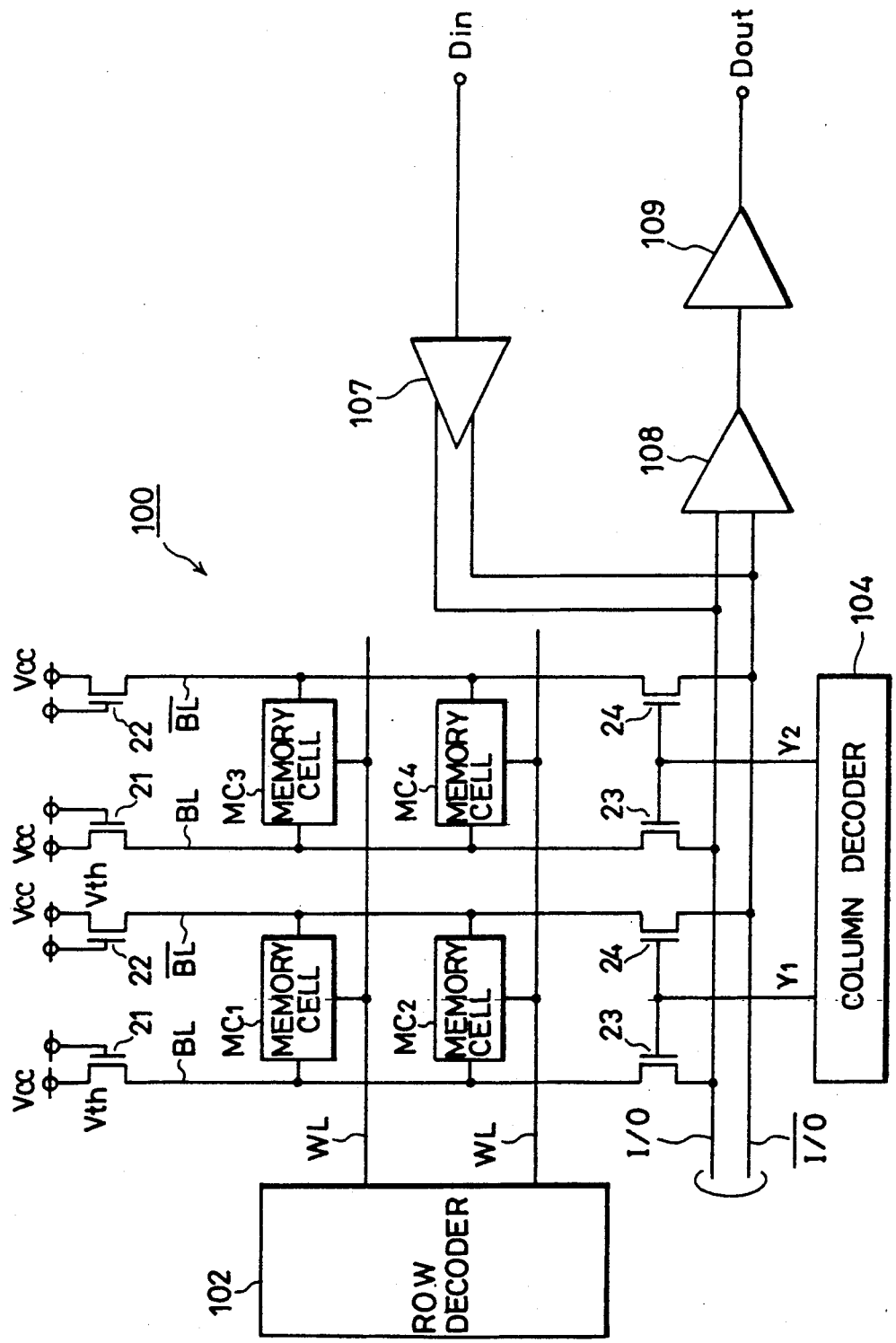
FIG. 9 illustrates the structure of a memory cell array shown in FIG. 8.
Figure 10:
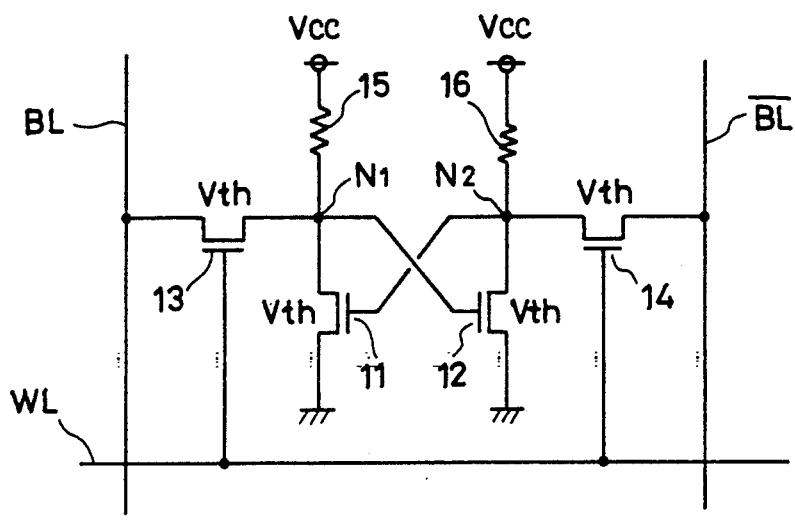
FIG. 10 is a circuit diagram showing exemplary structure of a memory cell in the conventional static RAM.
Figure 11:
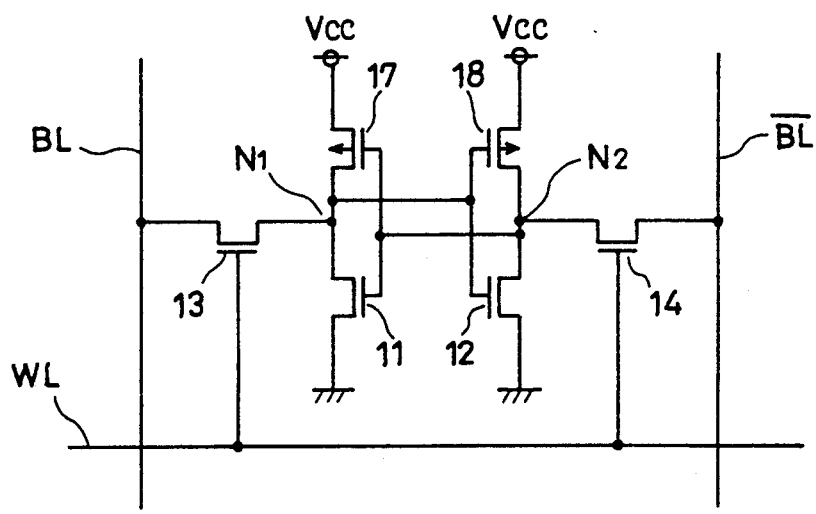
FIG. 11 is a circuit diagram showing another exemplary structure of the memory cell in the conventional static RAM.

Since data are written in the memory cell selected in write operation, no data will be lost. However, each pair of bit lines BL and $\overline{BL}$ are also connected with non-selected memory cells in addition to the selected memory cell, to which the data are written, as shown in FIG. 9. In data writing, one of the selected pair of bit lines BL and $\overline{BL}$ is set at a low-level potential while the other bit line is set at a high-level potential. In this case, the low-level potential is at least 1.0 V. The potential of the word line WL, which is connected to non-selected memory cells, is 0 V (ground potential), and hence the gate-to-source voltages of the access transistors 3 and 4 are below −0.3 V if the low-level potential on the bit line is in excess of about 0.3 V. Thus, no data will be lost since a leakage current flowing from the memory cell to the bit line is extremely small.

However, if the low-level potential on the bit line is reduced to the ground potential, the gate-to-source voltages of the access transistors 3 and 4 become 0 V. In this case, leakage currents are determined by the OFF resistance values $R_a$ of the access transistors 3 and 4. According to this embodiment, the OFF resistance values $R_a$ of the access transistors 3 and 4 are about twice to 10 times the resistance values Rl of the load resistances 5 and 6, and hence leakage currents slightly flow in the access transistors 3 and 4. Since the charges in the memory cell are discharged to the bit line with a long time constant of at least hundreds of microseconds, the data stored in the memory cell will be recovered if the write time is shorter than the said period, while the data may be lost from the memory cell if the write time is longer than this period.

Figure 3:
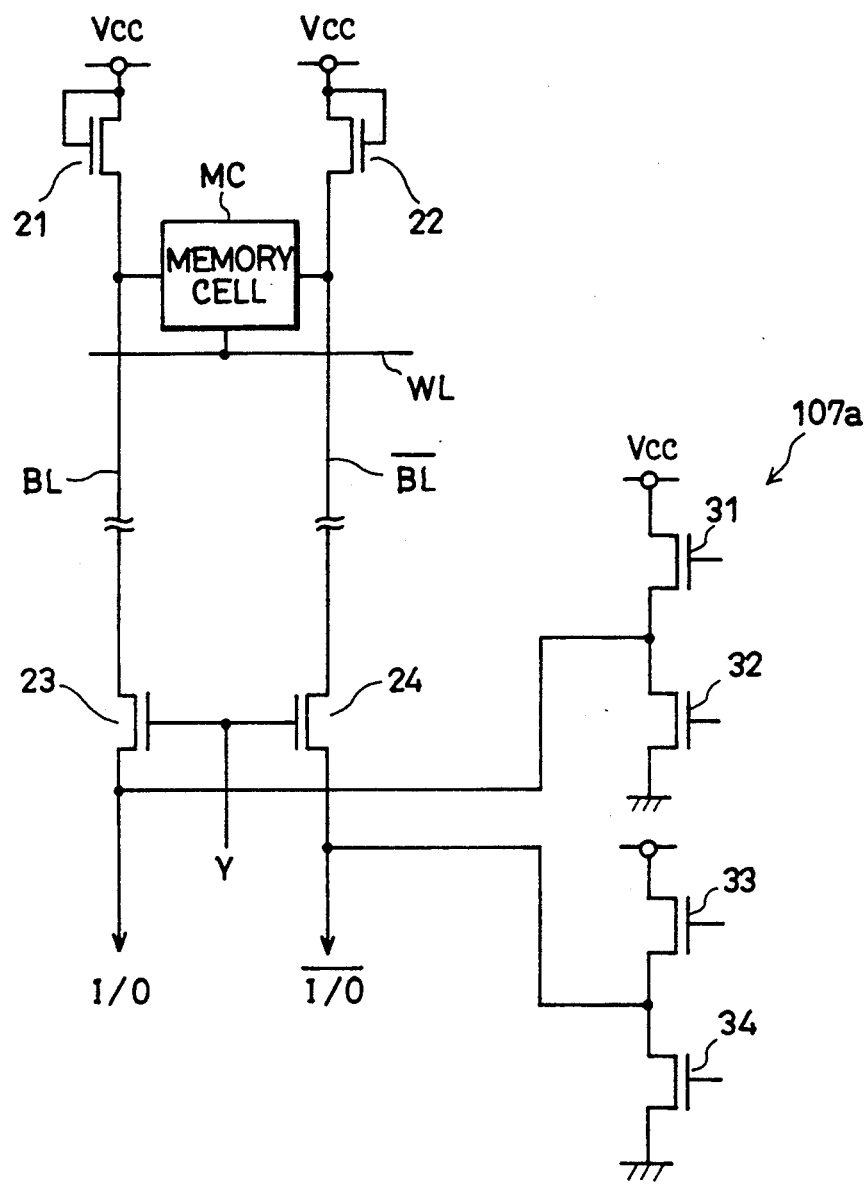
FIG. 3 is a circuit diagram showing an exemplary method of preventing data loss in write operation of the memory cell shown in FIG. 1.

According to this embodiment, therefore, data loss is prevented by one of the following two methods:

FIG. 3 shows a first method. Referring to FIG. 3, transistors 31 to 34 form a write driver 107a, which is provided in the data input buffer 107 shown in FIG. 8. This write driver 107a serves as a bit line driving circuit.

Figure 8:
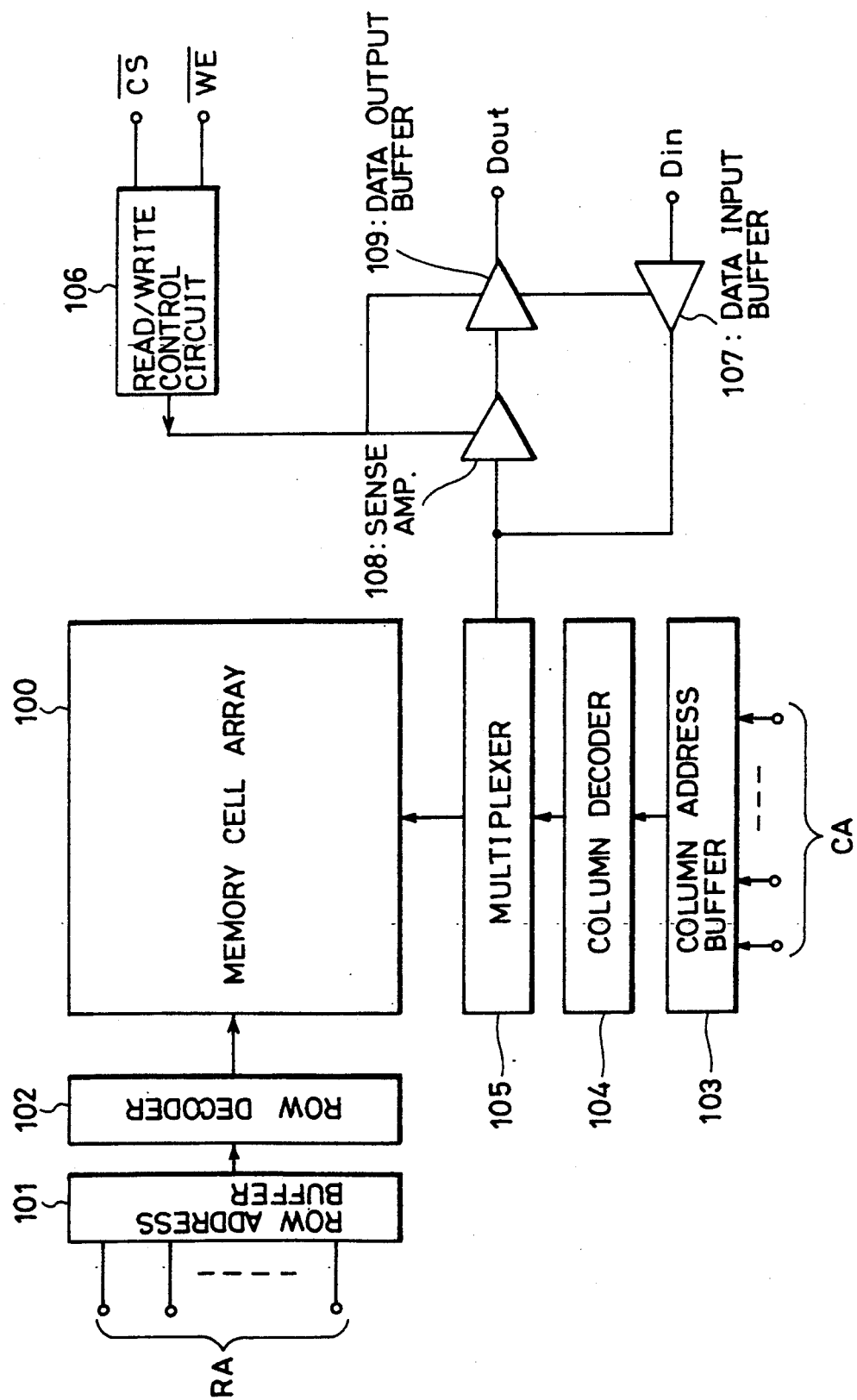
FIG. 8 is a block diagram showing the overall structure of a general static RAM.

When data are written in the memory cell MC, the potential of the word line WL is brought into a high level, and an output Y corresponding to the column including the memory cell MC is brought into a high level within the outputs of the column decoder 104 (FIG. 8). When the potential of the bit line BL is set at a low level and that of the bit line $\overline{BL}$ is set at a high level, for example, the transistors 32 and 33 are turned on while the transistors 31 and 34 are turned off.

In this case, the high-level potential on the bit line $\overline{BL}$ is lower than the source potential $V_{CC}$ by the threshold voltage $V_{th}$ of the bit line loading transistor 22. On the other hand, the low-level potential on the bit line BL is determined by the conductance of the bit line loading transistors 21 and that of a series circuit formed by the transfer gate 23 and the transistor 32. In other words, the low-level potential on the bit line BL is reduced as the total conductance of the transfer gate 23 and the transistor 32 is increased. This conductance is proportionate to the channel width of the transistor. Therefore, the conductance is so set that the low-level potential on the bit line BL is at least 0.3 V.

Figure 6:
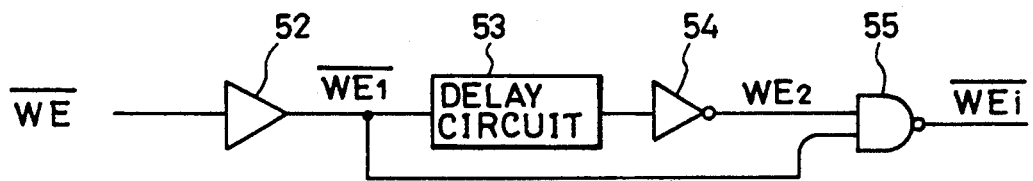
FIG. 6 is a circuit diagram showing another exemplary method of preventing data loss in write operation of the memory cell shown FIG. 1.
Figure 7:
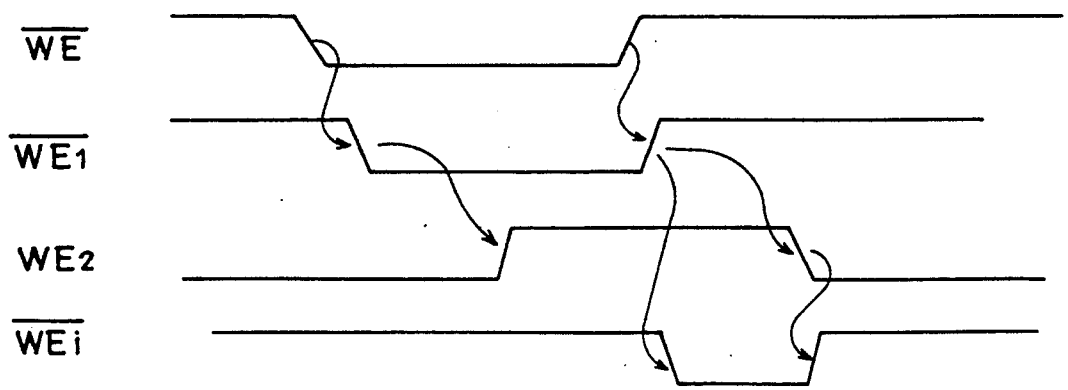
FIG. 7 is a timing chart showing the timing of an internal write signal obtained by the circuit shown in FIG. 6.

FIGS. 6 and 7 show a second method.

Figure 4:
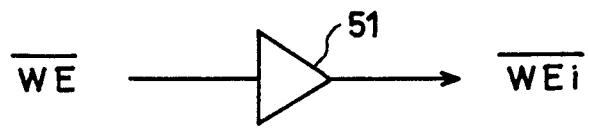
FIG. 4 illustrates a circuit for generating an internal write signal in a general static RAM.
Figure 5:
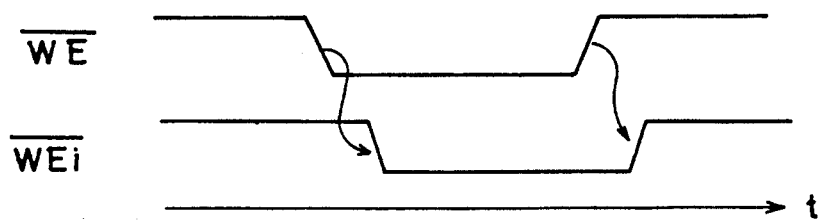
FIG. 5 is a timing chart showing an externally supplied write signal and an internal write signal in a general static RAM.

In a general static RAM, an externally supplied write signal $\overline{WE}$ passes through a buffer 51 to obtain an internal write signal $\overline{WEi}$, as shown in FIGS. 4 and 5. Data writing is performed during a period when the internal write signal $\overline{WEI}$ is at a low level. According to this embodiment, on the other hand, an externally supplied write signal $\overline{WE}$ passes through a buffer 52 to obtain an internal signal $\overline{WE1}$, which in turn passes through a delay circuit 53 and an inverter 54 to obtain another internal signal WE2, as shown in FIGS. 6 and 7. A NAND gate 55 obtains an internal write signal $\overline{WEi}$ from the internal signals $\overline{WE1}$ and WE2.

Thus, a one-shot pulse having pulse width of not more than several microseconds is generated in termination of the externally supplied write signal $\overline{WE}$, so that the data are written in the memory cell during the period when the one-shot pulse is generated. According to this method, write operation is completed before the data are lost from the memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:
   at least one memory cell;
   a word line provided for selecting said memory cell; and
   a bit line pair formed by first and second bit lines for writing or reading data in or from selected said memory cell,
   each said memory cell including:
   first and second storage nodes for storing complementary data,
   first load means being coupled between a prescribed source potential and said first storage node, and having a prescribed resistance value,
   second load means being coupled between said prescribed source potential and said second storage node, and having a prescribed resistance value,
   a first semiconductor element being coupled between said first storage node and the ground potential, and having a control terminal connected to said second storage node,
   a second semiconductor element being coupled between said second storage node and the ground potential, and having a control terminal connected to said first storage node,
   a third semiconductor element being coupled between said first bit line and said first storage node, and having a control terminal connected to said word line, and a fourth semiconductor element being coupled between said second bit line and said second storage node, and having a control terminal connected to said word line, threshold voltages of said first and second semiconductor elements being so set that respective ones of said first and second semiconductor elements have first OFF resistance values which are larger than respective said resistance values of said first and second load means, threshold voltages of respective said third an fourth semiconductor elements being so set that respective ones of said third and fourth semiconductor elements have second OFF resistance values which are larger than respective said resistance values of said first and second load means and smaller than said first OFF resistance values of said first and second semiconductor elements.

2. A static semiconductor memory device in accordance with claim 1, wherein said first, second, third and fourth semiconductor elements comprise first, second, third and fourth transistor elements respectively.

3. A static semiconductor memory device in accordance with claim 2, wherein respective ones of said first, second, third and fourth transistor elements comprise MOS transistors.

4. A static semiconductor memory device in accordance with claim 1, wherein said first and second load means comprise resistance means.

5. A static semiconductor memory device in accordance with claim 1, wherein threshold voltages of respective said first and second semiconductor elements are so set that said first OFF resistance values are 10 to 100 times said resistance values of respective said first and second load means, and threshold voltages of respective said third and fourth semiconductor elements are so set that said second OFF resistance values are twice to 10 times said resistance values of respective said first and second load means.

6. A static semiconductor memory device in accordance with claim 1, further comprising:

potential setting means for setting the potential on said first or second bit line and the potential of said word line in a selected state so that a logical low level potential on said first or second bit line is higher by a prescribed voltage than the potential of said word line in a selected state.

7. A static semiconductor memory device in accordance with claim 6, wherein said prescribed voltage is 0.3 V.

8. A static semiconductor memory device in accordance with claim 6, wherein said potential setting means includes:

first and second load elements connected between said first and second bit lines and said prescribed source potential respectively, and driver means connected to said first and second bit lines for writing data.

9. A static semiconductor memory device in accordance with claim 1, further comprising:

pulse generation means for generating a one-shot pulse having prescribed pulse width; and write means for writing data in said memory cell during a period of said one-shot pulse.

10. A static memory cell connected to a word line and first and second bit lines, said static memory cell comprising:

first and second storage nodes;

a first load element being coupled between a prescribed source potential and said first storage node, and having a prescribed resistance value;

a second load element being coupled between said prescribed source potential and said second storage node, and having a prescribed resistance value;

a first transistor being coupled between said first storage node and the ground potential, and having a control terminal connected to said second storage node;

a second transistor being coupled between said second storage node and the ground potential, and having a control terminal connected to said first storage node;

a third transistor being coupled between said first bit line and said first storage node, and having a control terminal connected to said word line; and a fourth transistor being coupled between said second bit line and said second storage node, and having a control terminal connected to said word line, threshold voltages of said first and second transistors being so set that respective ones of said first and second transistors have first OFF resistance values which are larger than respective said resistance values of said first and second load elements, threshold voltages of said third and fourth transistors being so set that respective ones of said third and fourth transistors have second OFF resistance values which are larger than respective said resistance values of said first and second load elements and smaller than said first OFF resistance values.

11. A method of setting threshold voltages of transistors in a high resistance/load type static memory cell comprising first and second load elements, cross-coupled first and second transistors for storing data, and third and fourth transistors for access operation, said method comprising the steps of:

setting threshold voltages of said first and second transistors so that respective ones of said first and second transistors have first OFF resistance values which are larger than respective resistance values of said first and second load elements; and setting threshold voltages of said third and fourth transistors so that respective ones of said third and fourth transistors have second OFF resistance values which are larger than respective said resistance values of said first and second load elements and smaller than said first OFF resistance values.

* * * * *